(12) United States Patent
Lee

(10) Patent No.: US 7,884,001 B2
(45) Date of Patent: Feb. 8, 2011

(54) IMAGE SENSOR AND METHOD FOR MANUFACTURING THE SAME

(75) Inventor: Joung-Ho Lee, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 58 days.

(21) Appl. No.: 12/344,501

(22) Filed: Dec. 27, 2008

(65) Prior Publication Data

US 2009/0166777 A1 Jul. 2, 2009

(30) Foreign Application Priority Data

Dec. 27, 2007 (KR) ............... 10-2007-0139274

(51) Int. Cl.
*H01L 21/425* (2006.01)
(52) U.S. Cl. ............... 438/531; 438/57; 438/81; 438/514; 438/515; 257/E21.473
(58) Field of Classification Search ............... 438/81, 438/57, 514, 515, 531; 257/465, 653, 654, 257/E21.473
See application file for complete search history.

(56) References Cited

U.S. PATENT DOCUMENTS

| | | | | |
|---|---|---|---|---|
| 5,041,896 | A * | 8/1991 | Temple et al. ............... 257/496 |
| 5,097,316 | A * | 3/1992 | Soclof ............... 257/559 |
| 6,147,372 | A * | 11/2000 | Yang et al. ............... 257/232 |
| 6,207,981 | B1 * | 3/2001 | Hatano et al. ............... 257/221 |
| 2003/0143792 | A1 * | 7/2003 | Satoh et al. ............... 438/197 |
| 2006/0076588 | A1 * | 4/2006 | Nozaki ............... 257/292 |
| 2007/0210385 | A1 * | 9/2007 | Ker et al. ............... 257/356 |

* cited by examiner

*Primary Examiner*—Angel Roman
(74) *Attorney, Agent, or Firm*—Sherr & Vaughn, PLLC

(57) ABSTRACT

Embodiments relate to an image sensor and a method of manufacturing an image sensor. According to embodiments, an image sensor may include a gate over a semiconductor substrate, a first impurity region over the semiconductor substrate, a second impurity region over the semiconductor substrate, the second impurity region being shallower than the first impurity region, and a third impurity region formed in the first impurity region, and bent toward the gate at a predetermined angle. According to embodiments, the third impurity region may be an n-type impurity region. According to embodiments, an area of a photodiode may be increased and a transfer efficiency of electrons generated from a photodiode may be increased.

14 Claims, 5 Drawing Sheets

IMAGE SENSOR AND METHOD FOR MANUFACTURING THE SAME

The present application claims priority under 35 U.S.C. 119 to Korean Patent Application No. 10-2007-0139274 (filed on Dec. 27, 2007), which is hereby incorporated by reference in its entirety.

BACKGROUND

An image sensor may be a semiconductor device that converts an optical image to an electrical signal. An image sensor may be classified as a charge coupled device (CCD) or a complementary metal-oxide semiconductor (CMOS) image sensor (CIS). In a CCD, respective MOS capacitors may be arranged close to one another and charge carriers may be stored in the capacitors and transferred.

CMOS technology may use a control circuit and a signal processing circuit as peripheral circuits. A CMOS image sensor may include a number of MOS transistors corresponding to a number of pixels, and may detect outputs in sequence using the MOS transistors in a switching manner. A CMOS image sensor may include a photodiode and a MOS transistor in a unit pixel. A CMOS image sensor may sequentially detect signals in a switching manner, and may thus determine an image. Sensitivity of a photodiode may be important to an operation of a CMOS image sensor.

SUMMARY

Embodiment relate to an image sensor and a method for manufacturing the same.

According to embodiments, an image sensor may include at least one of the following. A gate on and/or over a semiconductor substrate. A first impurity region on and/or over the semiconductor substrate formed with the gate. A second impurity region on and/or over the semiconductor substrate, the second impurity region being shallower than the first impurity region. A third impurity region formed in the first impurity region, and bent toward the gate at a predetermined angle. According to embodiments, the third impurity region may be an n-type impurity region.

According to embodiments, a method for manufacturing an image sensor may include at least one of the following. Forming a gate on and/or over a semiconductor substrate. Forming a first impurity region on and/or over the semiconductor substrate formed with the gate, the first impurity region being bent toward the gate at a predetermined angle. Forming a second impurity region on and/or over the semiconductor substrate including the first impurity region. Forming a third impurity region shallower than the second impurity region on and/or over the semiconductor substrate. According to embodiments, the first impurity region may be doped with n-type dopants.

DRAWINGS

Example FIGS. 1 though 5B are sectional views illustrating an image sensor and a method for manufacturing an image sensor according to embodiments.

DESCRIPTION

Figure 5A:
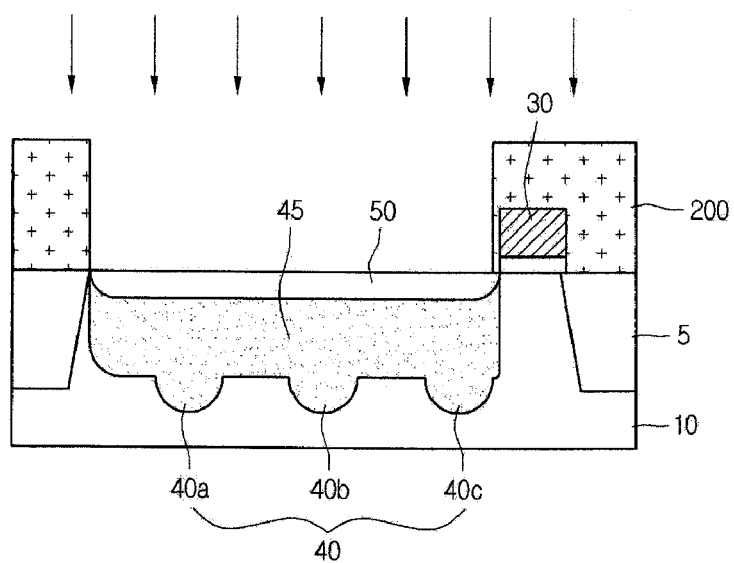

Example FIG. 5A is a sectional view illustrating an image sensor according to embodiments. Referring to example FIG. 5A, an image sensor according to embodiments may include gate 30 formed on and/or over semiconductor substrate 10, and first, second, and third impurity regions 40, 45, and 50 on and/or over semiconductor substrate 10. According to embodiments, semiconductor substrate 10 may be formed with a lightly-doped p-type epitaxial layer on and/or over a heavily-doped p++-type silicon substrate. A lightly-doped p-type epitaxial layer may enlarge and deepen a depletion region of a photodiode. This may increase an ability of a photodiode to collect optical charges. According to embodiments, gate 30 may include an oxide layer pattern and a polysilicon pattern.

If a heavily-doped p++-type substrate is formed below a p-type epitaxial layer, optical charges may be recombined with each other. Combined optical charges may then be diffused to an adjacent unit pixel. According to embodiments, a random diffusion of optical charges may be reduced. This may reduce a delivery variation of optical charges.

According to embodiments, first and second impurity regions 40 and 45 may be doped with at least one of phosphorus (P) and arsenic (As), which may be n-type dopants. According to embodiments, third impurity region 50 may be doped with boron (B), which may be a p-type dopant.

According to embodiments, first impurity region 40 may be deeper than second impurity region 45. First impurity region 40 may be inclined and/or bent toward gate 30 at a predetermined angle. First impurity region 40 may include a plurality of impurity regions 40a, 40b, 40c.

First impurity region 40 may overlap with second impurity region 45. The overlap region of first impurity region 40 and second impurity region 45 may have a density higher than that of first impurity region 40 or second impurity region 45. According to embodiments, third impurity region 50 may be shallower than second impurity region 45.

Since first impurity region 40 may be inclined toward gate 30 at a predetermined angle, an electric filed may be formed toward gate 30. According to embodiments, electrons generated from a photodiode may be easily moved to gate 30. In other words, a transfer efficiency of electrons generated from a photodiode may be raised, which may increase a saturation current and may prevent lagging. A sensitivity of an image sensor may thereby be improved.

Example FIGS. 1 through 5A are sectional views illustrating a method for manufacturing an image sensor, according to embodiments. Example FIG. 1A is a side sectional view illustrating a method for manufacturing an image sensor, according to embodiments. Example FIG. 1B is a plan view illustrating a method for manufacturing an image sensor, according to embodiments.

Figure 1A:
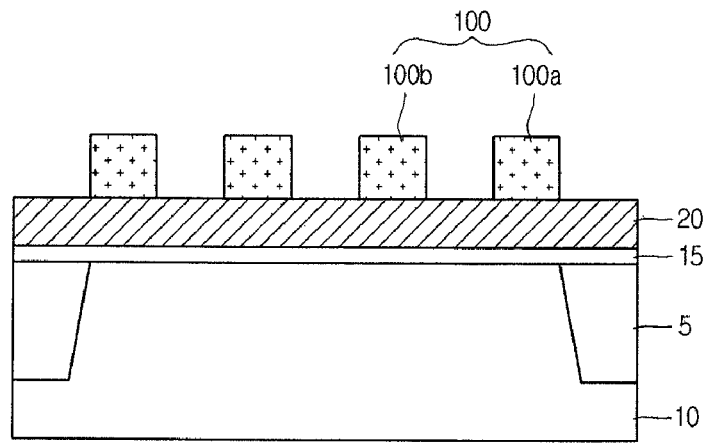
Figure 1B:
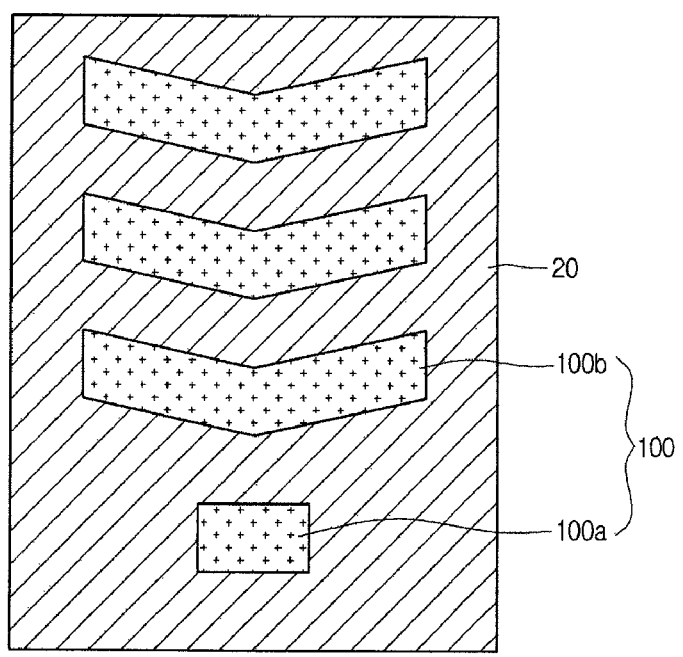

Referring to example FIGS. 1A and 1B, oxide layer 15, polysilicon layer 20, and first photoresist pattern 100 may be formed on and/or over semiconductor substrate 10. Semiconductor substrate may include isolation layer 5.

Semiconductor substrate 10 may be formed with a lightly-doped p-type epitaxial layer on and/or over a heavily-doped p++-type silicon substrate. The lightly-doped p-type epitaxial layer may enlarge and deepen in a depletion region of the photodiode. This may increase an ability of a photodiode to collect optical charges.

If a heavily-doped p++-type substrate is formed below the p-type epitaxial layer, optical charges may be recombined with each other before optical charges may be diffused to an adjacent unit pixel. Accordingly, random diffusion of optical charges may be reduced, and a delivery variation of the optical charges may be reduced. According to embodiments, isolation layer 5 may be formed by forming a trench in semiconductor substrate 10 and filling an insulating material in the trench.

Referring to example FIG. 1B, first photoresist pattern 100 may be disposed on and/or over a gate region and a polysilicon pattern region. First photoresist pattern 100b on and/or over the polysilicon pattern area may be inclined and/or bent toward second photoresist pattern 100a, which may be disposed on and/or over a gate region, at a predetermined angle.

First photoresist pattern 100b may be disposed on and/or over a region where a polysilicon pattern may later be formed, and may have a rectangular shape in which a central part of first photoresist pattern 100b may be angularly directed toward gate 30.

Figure 2A:
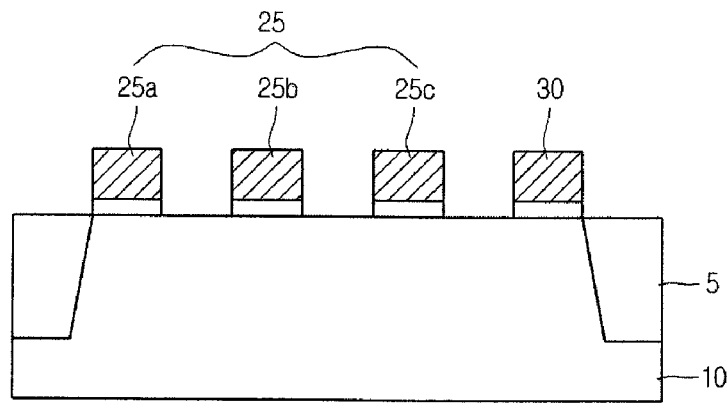
Figure 2B:
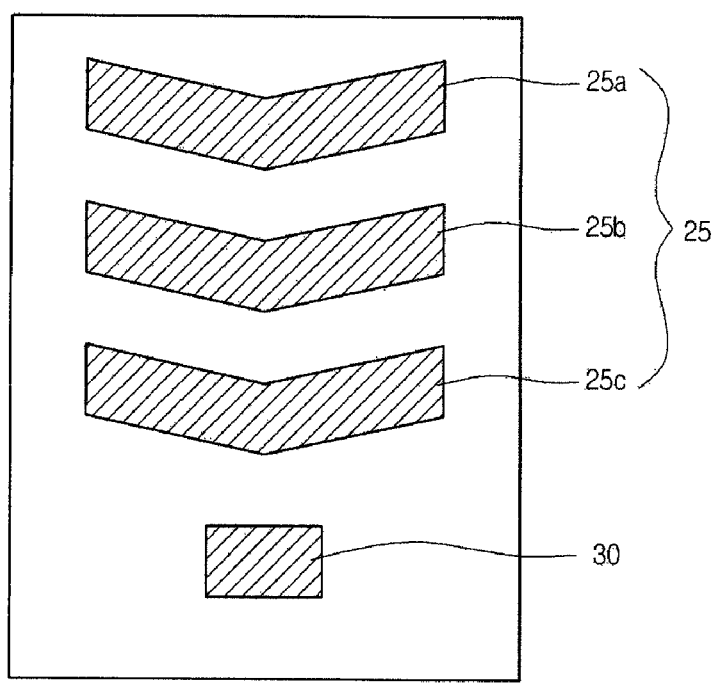

Referring to example FIGS. 2A and 2B, polysilicon layer 20 and oxide layer 15 may be etched. This may form gate 30 and polysilicon pattern 25. According to a shape of first photoresist pattern 100, polysilicon pattern 25 and gate 30 may be formed. According to embodiments, first photoresist pattern 100 may then be removed, for example through an ashing process. According to embodiments, gate 30 may be a transfer gate. According to embodiments, gate 30 may include polysilicon. According to embodiments, gate 30 is not limited thereto, and may include a metal silicide layer.

Figure 3A:
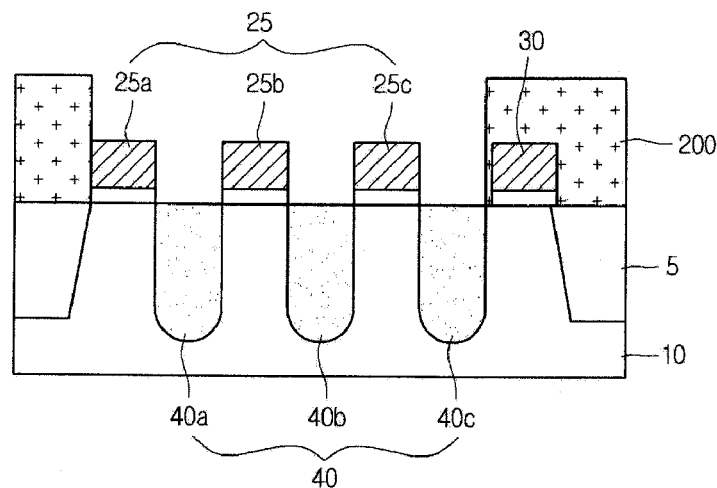
Figure 3B:
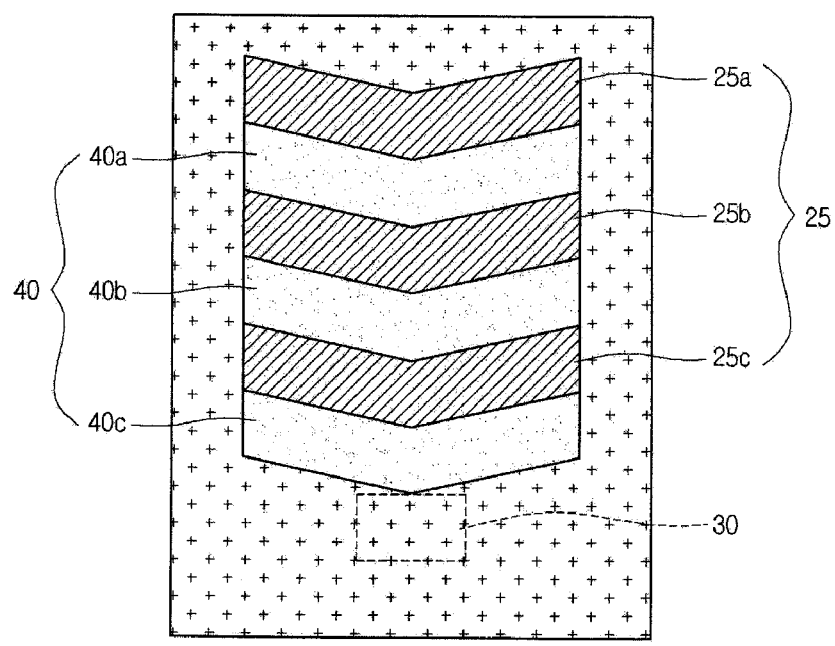

Referring to example FIGS. 3A and 3B, second photoresist pattern 200 may be formed on and/or over semiconductor substrate 10 having polysilicon pattern 25. According to embodiments, first impurity region 40 may be formed through a first ion implantation process. According to embodiments, second photoresist pattern 200 may cover gate 300.

First impurity region 40 may be formed by implanting at least one of phosphorus (31P+) and arsenic (75As+) into semiconductor substrate 10. According to embodiments, polysilicon pattern 25 and second photoresist pattern 200 may be used as a mask for this procedure.

According to embodiments, a first ion implantation process may be performed using arsenic (75As+) at a dose of approximately $3\times10^{11}$ to $3\times10^{12}$ atoms/cm$^2$ and an energy of approximately 200 KeV to 300 KeV. According to embodiments, a first ion implantation process may not be limited to this configuration, but may be performed with various dopants at different doses and energy levels, according to characteristics of products.

Referring to example FIG. 3B, first impurity region 40 may be alternately aligned with polysilicon pattern 25. Accordingly, first impurity region 40 may be bent toward gate 30 at a predetermined angle. This may be similar to a shape of polysilicon pattern 25. According to embodiments, a central portion of first impurity region 40 having a long rectangular shape may be bent toward gate 30. Polysilicon pattern 25 may then be removed, for example through a wet etch process.

According to embodiments, although polysilicon pattern 25 may include three polysilicon patterns (first, second, and third polysilicon patterns 25a, 25b, and 25c), a number of polysilicon patterns is not limited thereto. According to embodiments, a number of polysilicon patterns may be greater than or fewer than three. According to embodiments, a number of first impurity regions 40 may vary according to a number of polysilicon patterns 25.

Figure 4:
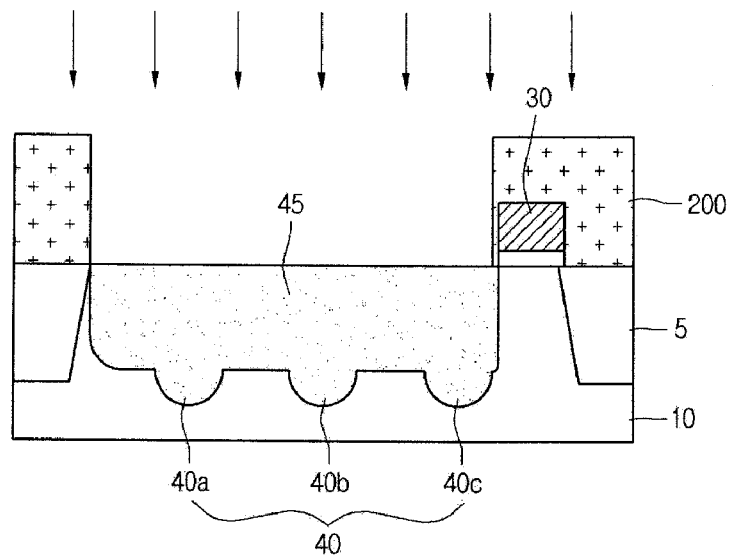

Referring to example FIG. 4, a second ion implantation process may be performed by using second photoresist pattern 200 as a mask. This may form second impurity region 45. According to embodiments, second impurity region 45 may be formed by implanting at least one of phosphorus (31P+) and arsenic (75As+), which may be n-type dopants, into semiconductor substrate 10. According to embodiments, second photoresist pattern 200 may be used as a mask for this implantation.

According to embodiments, a second ion implantation process to implant an n-type dopant may be performed at energy corresponding to approximately ¾ energy of the first ion implantation process. For example, a second ion implantation process may be formed using arsenic (75As+) at a dose of approximately $5\times10^{11}$ atoms/cm$^2$ to $5\times10^{12}$ atoms/cm$^2$ and an energy of approximately 150 KeV to 200 KeV. According to embodiments, a second ion implantation process is not limited to such a configuration, but may be performed with various dopants at different doses and energy levels, according to characteristics of products. According to embodiments, to increase a saturation current, a second implantation process may be performed twice.

First impurity region 40 may overlap with second impurity region 45. According to embodiments, an overlap region of first impurity region 40 and second impurity region 45 may have a density higher than that of first impurity region 40 or second impurity region 45.

According to embodiments, second impurity region 45 may be more shallow than first impurity region 40. According to embodiments, since second impurity region 45 may be a heavily doped region, a photodiode that may be formed according to embodiments may be heavily doped. This may increase a saturation current.

Referring to example FIG. 5A, third impurity region 50 may be formed, for example, by performing a third ion implantation process. According to embodiments, second photoresist pattern 200 may be used as a mask for this process. Second photoresist pattern 200 may then be removed.

Third impurity region 50 may be formed by implanting at least one of boron (B) and BF2+, which may be a p-type dopant, into semiconductor substrate 10. According to embodiments, second photoresist pattern 200 may be used as a mask to form third impurity region 50. Third impurity region 50 may thus be formed. According to embodiments, a photodiode including first, second, and third impurity regions 40, 45, and 50 may thus be formed.

According to embodiments, first, second, and third impurity regions 40, 45, and 50 may make contact with semiconductor substrate 10. According to embodiments, a photodiode may thus be a PNP photodiode.

A photodiode may have a higher density at first impurity region 40, and a portion of photodiode that may have a higher density may be inclined toward gate 30 at a predetermined angle.

Figure 5B:
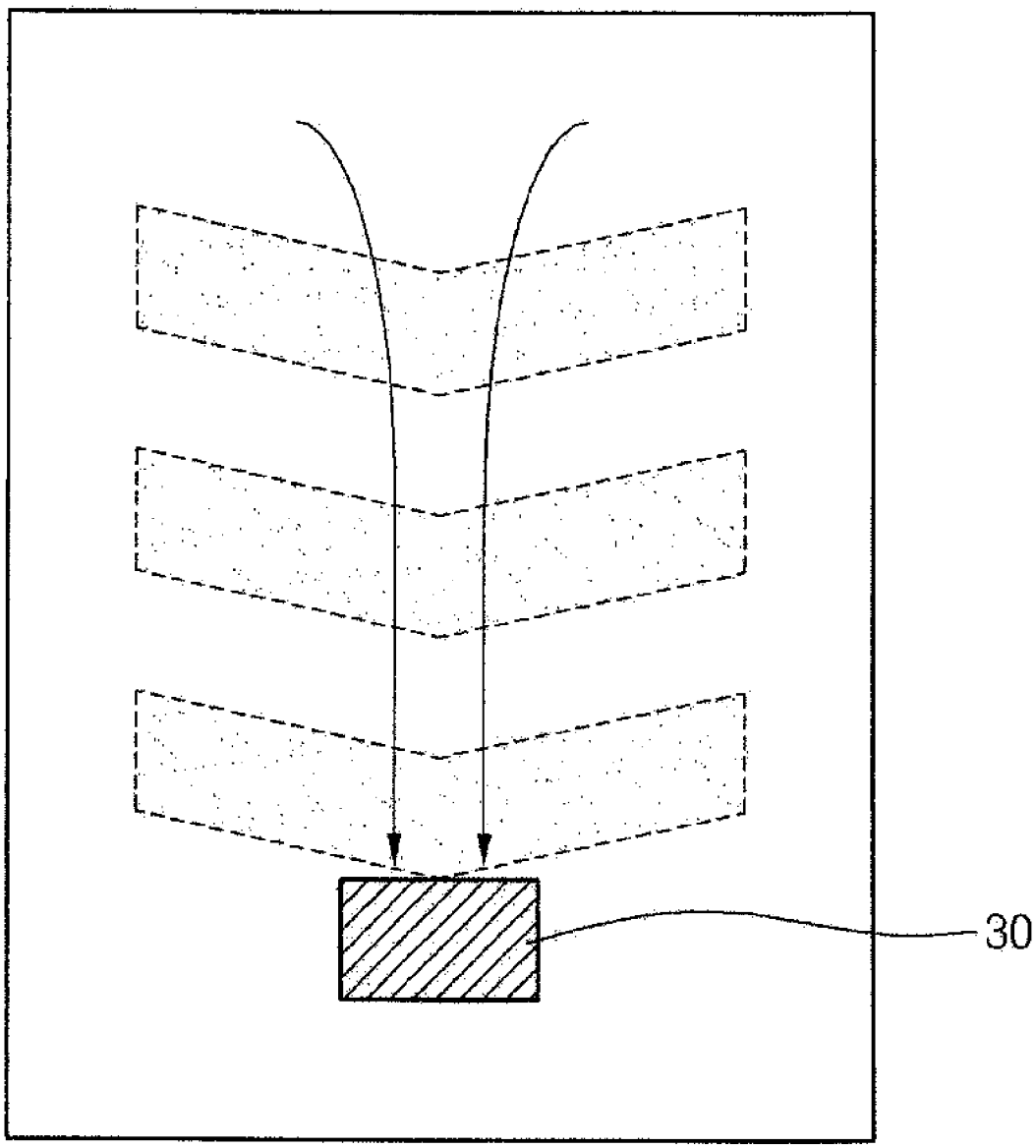

Accordingly, referring to example FIG. 5B, an electric field may be formed toward gate 30. Electrons generated from a photodiode may thus be relatively easily moved to gate 30. This may increase a transfer efficiency of electrons generated from a photodiode. A saturation current may thus be increased, which may prevent lagging. Accordingly, a sensitivity of an image sensor may be improved.

According to embodiments, a floating diffusion region may be formed on and/or over semiconductor substrate 10. According to embodiments, a metal interconnection layer, a color filter array, and a micro-lens may also be formed on and/or over semiconductor substrate 10.

According to embodiments, an image sensor and a method for manufacturing the same may include an ion implantation layer bent and/or inclined toward the gate. This may increase an area of a photodiode.

According to embodiments, a transfer efficiency of electrons generated from a photodiode may be increased. This may increase a saturation current and may substantially prevent lagging. According to embodiments, a sensitivity of an image sensor and reliability of an image sensor may be improved.

According to embodiments, although a structure of a CMOS image sensor (CIS) may be described with reference to the accompanying drawings, embodiments are not limited thereto. According to embodiments, an ion implantation layer bent toward the gate may be used in any image sensor, including a charged coupled device (CCD) image sensor.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method, comprising:

forming a gate over a semiconductor substrate;

forming a first impurity region that comprises a plurality of impurity regions in the semiconductor substrate, wherein the plurality of impurity regions of the first impurity region are separated from each other, arranged in parallel, and identically bent toward the gate at a predetermined angle when looked from a top view of substrate;

forming a second impurity region that overlaps with the first impurity region in the semiconductor substrate including the first impurity region, wherein the first impurity region is deeper than the second impurity region; and forming a third impurity region shallower than the second impurity region over the first and second impurity regions.

2. The method of claim 1, wherein the first impurity region is doped with n-type dopants.

3. The method of claim 2, wherein the second impurity region comprises an n-type impurity region, and the third impurity region comprises a p-type impurity region.

4. The method of claim 1, wherein the semiconductor substrate comprises a lightly-doped p-type epitaxial layer over a heavily-doped p++-type silicon substrate.

5. The method of claim 1, wherein forming the first impurity region comprises:

forming the gate and a polysilicon pattern over the semiconductor substrate;

forming a photoresist pattern covering the gate over the semiconductor substrate;

forming the first impurity region over the semiconductor substrate by performing an ion implantation process using the polysilicon pattern and the photoresist pattern as a mask; and removing the polysilicon pattern;

forming the second impurity region over the first impurity region by performing a second ion implantation process using the photoresist pattern as a mask;

forming the third impurity region over the second impurity region by performing a third ion implantation process using the photoresist pattern as a mask; and removing the photoresist pattern.

6. The method of claim 5, wherein the gate and the polysilicon pattern are simultaneously formed.

7. The method of claim 1, wherein the first impurity region is formed deeper in the semiconductor substrate than the second impurity region.

8. The method of claim 1, wherein the first impurity region comprises a plurality of impurity regions.

9. The method of claim 8, wherein a portion of the second impurity region overlaps the first impurity region in an overlap region, and wherein a density of the overlap region is greater than a density of either the first impurity region or the second impurity region.

10. The method of claim 1, wherein the first impurity region is formed by implanting at least one of phosphorus (31P+) and arsenic (75As+) into the semiconductor substrate.

11. The method of claim 10, wherein the ion implantation process to form the first impurity region is performed using arsenic (75As+) at a dose of approximately $3 \times 10^{11}$ atoms/cm$^2$ to $3 \times 10^{12}$ atoms/cm$^2$ and an energy of approximately 200 KeV to 300 KeV.

12. The method of claim 11, comprising forming the second impurity region at an energy level corresponding to approximately ¾ of the energy used to form the first impurity region.

13. The method of claim 11, wherein the second impurity region is formed through an ion implantation process using arsenic (75As+) at a dose of approximately $5 \times 10^{11}$ atoms/cm$^2$ to $5 \times 10^{12}$ atoms/cm$^2$ and an energy of approximately 150 KeV to 200 KeV.

14. The method of claim 1, comprising doping the first and second impurity regions with at least one of phosphorus (P) and arsenic (As), and doping the third impurity region with boron (B).

* * * * *